(12) United States Patent
Fan

(10) Patent No.: US 12,317,596 B2
(45) Date of Patent: May 27, 2025

(54) SEMICONDUCTOR DEVICE AND MANUFACTURING METHOD THEREOF

(71) Applicant: AUO Corporation, Hsinchu (TW)

(72) Inventor: Yang-Shun Fan, Hsinchu (TW)

(73) Assignee: AUO Corporation, Hsinchu (TW)

( * ) Notice: Subject to any disclaimer, the term of this patent is extended or adjusted under 35 U.S.C. 154(b) by 489 days.

(21) Appl. No.: 17/881,612

(22) Filed: Aug. 5, 2022

(65) Prior Publication Data

US 2023/0187454 A1 Jun. 15, 2023

Related U.S. Application Data

(60) Provisional application No. 63/287,695, filed on Dec. 9, 2021.

(30) Foreign Application Priority Data

Mar. 23, 2022 (TW) .................................. 111110923

(51) Int. Cl.
*H10D 86/60* (2025.01)
*H01L 21/02* (2006.01)
(Continued)

(52) U.S. Cl.
CPC ....... *H10D 86/60* (2025.01); *H01L 21/02565* (2013.01); *H10D 30/475* (2025.01); *H10D 30/6734* (2025.01); *H10D 30/6739* (2025.01); *H10D 30/6755* (2025.01); *H10D 62/80* (2025.01); *H10D 86/0221* (2025.01);
(Continued)

(58) Field of Classification Search
None
See application file for complete search history.

(56) References Cited

U.S. PATENT DOCUMENTS

| 11,227,875 B2 | 1/2022 | Kim et al. |
| 2015/0214248 A1 | 7/2015 | Chou |

(Continued)

FOREIGN PATENT DOCUMENTS

| CN | 112310151 | 2/2021 |
| CN | 113571533 | 10/2021 |
| KR | 102241097 | 4/2021 |

OTHER PUBLICATIONS

Yang-Shun Fan et al., "High Capacity Memory using Oxide Based Schottky Diode and Unipolar Resistive Array," SID Symposium Digest of Technical Papers, Jun. 2015, pp. 1213-1216.

*Primary Examiner* — Bo B Jang
(74) *Attorney, Agent, or Firm* — JCIPRNET

(57) ABSTRACT

A semiconductor device includes a substrate, a first thin-film transistor, and a second thin-film transistor. The first and second thin-film transistors are disposed on the substrate. The first thin-film transistor includes stacked first and second metal oxide layers. An oxygen concentration of the first metal oxide layer is less than an oxygen concentration of the second metal oxide layer, and a thickness of the second metal oxide layer is less than a thickness of the first metal oxide layer. A two-dimensional electron gas is located at an interface between the first and second metal oxide layers. The second thin-film transistor is electrically connected to the first thin-film transistor. The second thin-film transistor includes a third metal oxide layer. The second and third metal oxide layers belong to a same patterned layer.

19 Claims, 12 Drawing Sheets

(51) Int. Cl.
*H10D 30/47* (2025.01)
*H10D 30/67* (2025.01)
*H10D 62/80* (2025.01)
*H10D 86/01* (2025.01)
*H10D 86/40* (2025.01)
*H10D 99/00* (2025.01)

(52) U.S. Cl.
CPC ......... *H10D 86/423* (2025.01); *H10D 86/427* (2025.01); *H10D 99/00* (2025.01)

(56) References Cited

U.S. PATENT DOCUMENTS

| | | | |
|---|---|---|---|
| 2017/0207246 A1* | 7/2017 | Wu | H10D 86/0212 |
| 2018/0261632 A1* | 9/2018 | Choi | H10D 86/60 |
| 2019/0189773 A1 | 6/2019 | Ningaraju et al. | |
| 2021/0036028 A1 | 2/2021 | Kim et al. | |
| 2023/0207701 A1* | 6/2023 | Jeong | H10D 30/6755 |
| | | | 257/288 |

* cited by examiner

SEMICONDUCTOR DEVICE AND MANUFACTURING METHOD THEREOF

CROSS-REFERENCE TO RELATED APPLICATION

This application claims the priority benefits of U.S. provisional application serial no. 63/287,695, filed on Dec. 9, 2021, and Taiwanese application serial no. 111110923, filed on Mar. 23, 2022. The entirety of each of the above-mentioned patent applications is hereby incorporated by reference herein and made a part of this specification.

BACKGROUND OF THE INVENTION

Field of the Invention

The invention relates to a semiconductor device, and more particularly, to a semiconductor device including a metal oxide layer and a manufacturing method thereof.

Description of Related Art

Currently, common thin-film transistors usually adopt amorphous silicon semiconductors as channels, and amorphous silicon semiconductors are widely used in various thin-film transistors due to their simple manufacturing process and low cost.

With the advancement of display techniques, the resolution of display panels has been improving year by year. In order to shrink thin-film transistors in pixel circuits, many manufacturers are working on developing new semiconductor materials, such as metal oxide semiconductor materials. Among metal oxide semiconductor materials, indium gallium zinc oxide (IGZO) has the advantages of small area and high electron mobility, and is therefore regarded as an important new semiconductor material.

SUMMARY OF THE INVENTION

The invention provides a semiconductor device having the advantages of high efficiency and low manufacturing cost.

The invention provides a manufacturing method of a semiconductor device having the advantage of low manufacturing cost, and the resulting semiconductor device has the advantage of high efficiency.

At least one embodiment of the invention provides a semiconductor device. The semiconductor device includes a substrate, a first thin-film transistor, and a second thin-film transistor. The first thin-film transistor and the second thin-film transistor are disposed on the substrate. The first thin-film transistor includes a stacked first metal oxide layer and second metal oxide layer. An oxygen concentration of the first metal oxide layer is less than an oxygen concentration of the second metal oxide layer, and a thickness of the second metal oxide layer is less than a thickness of the first metal oxide layer. A two-dimensional electron gas is located at an interface between the first metal oxide layer and the second metal oxide layer. The second thin-film transistor is electrically connected to the first thin-film transistor. The second thin-film transistor includes a third metal oxide layer. The second metal oxide layer and the third metal oxide layer belong to a same patterned layer.

At least one embodiment of the invention provides a manufacturing method of a semiconductor device, including: forming a first thin-film transistor on a substrate, and the first thin-film transistor includes a stacked first metal oxide layer and second metal oxide layer, wherein an oxygen concentration of the first metal oxide layer is less than an oxygen concentration of the second metal oxide layer, a thickness of the second metal oxide layer is less than a thickness of the first metal oxide layer, and a two-dimensional electron gas is located at an interface between the first metal oxide layer and the second metal oxide layer; and forming a second thin-film transistor on the substrate, wherein the second thin-film transistor is electrically connected to the first thin-film transistor, the second thin-film transistor includes a third metal oxide layer, and the second metal oxide layer and the third metal oxide layer are formed simultaneously.

DESCRIPTION OF THE EMBODIMENTS

Figure 1:
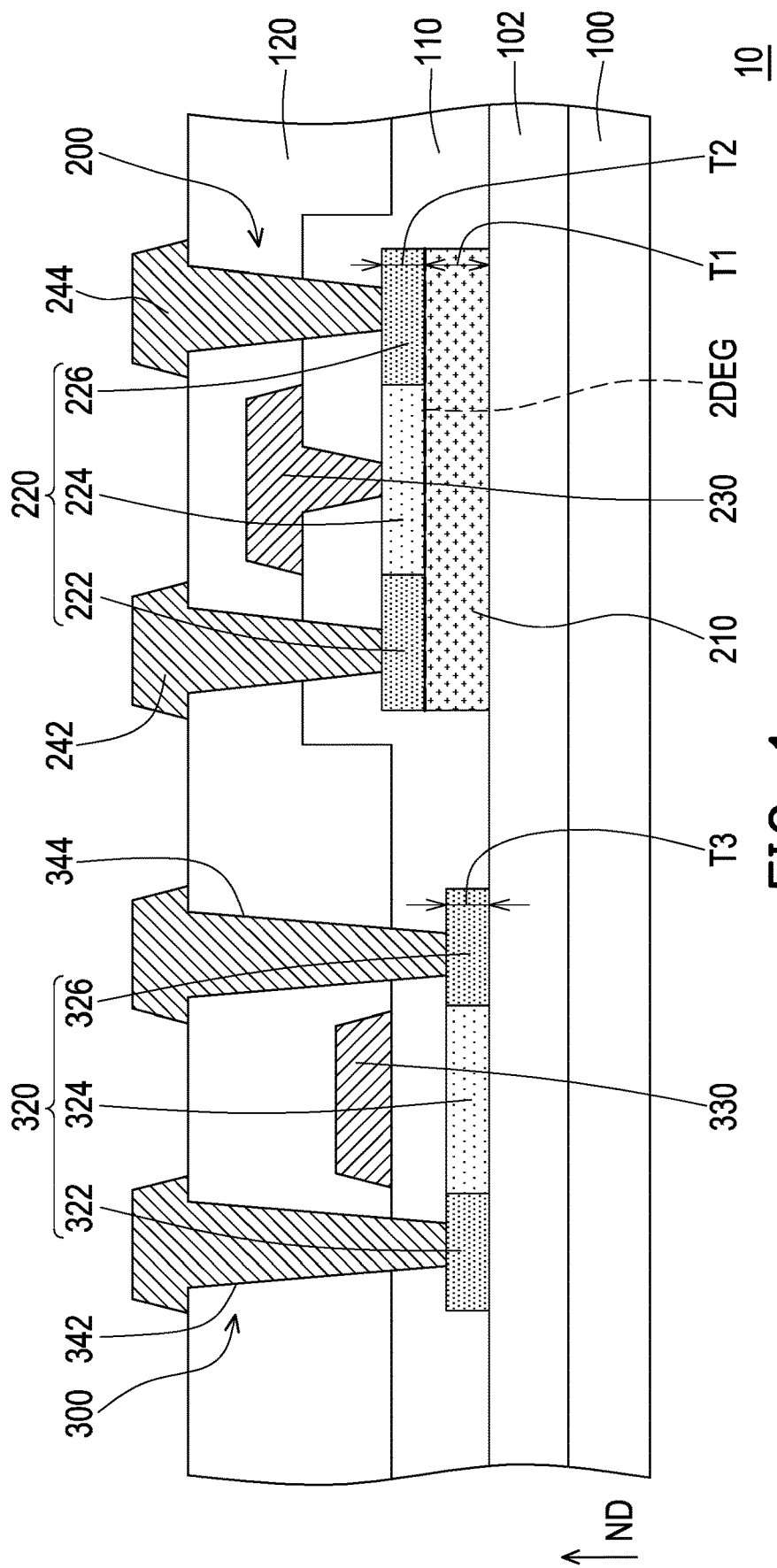
FIG. 1 is a schematic cross-sectional view of a semiconductor device according to an embodiment of the invention.

FIG. 1 is a schematic cross-sectional view of a semiconductor device according to an embodiment of the invention.

Referring to FIG. 1, a semiconductor device 10 includes a substrate 100, a first thin-film transistor 200, and a second thin-film transistor 300.

The material of the substrate 100 includes, for example, glass, quartz, organic polymer, or an opaque/reflective material (such as conductive material, metal, wafer, ceramic, or other suitable materials), or other suitable materials.

The buffer layer 102 is formed on the surface of the substrate 100. The material of the buffer layer 102 includes, for example, silicon oxide, silicon nitride, silicon oxynitride, or other insulating materials. In some embodiments, the buffer layer 102 is a single-layer structure or a multi-layer structure.

The first thin-film transistor 200 is disposed on the substrate 100. In the present embodiment, the first thin-film transistor 200 is formed on the buffer layer 102. The first thin-film transistor 200 includes a first metal oxide layer 210, a second metal oxide layer 220, a first gate 230, a first source 242, and a first drain 244.

The first metal oxide layer 210 and the second metal oxide layer 220 are located on the substrate 100 and stacked on each other. In the present embodiment, the first metal oxide layer 210 and the second metal oxide layer 220 are sequentially formed on the buffer layer 102. The oxygen concentration of the first metal oxide layer 210 is less than the oxygen concentration of the second metal oxide layer 220. In some embodiments, the oxygen concentration of the first metal oxide layer 210 is 10 at % to 50 at %, and the oxygen concentration of the second metal oxide layer 220 is 30 at % to 70 at %. In some embodiments, by adjusting the oxygen concentration, the band gap of the first metal oxide layer 210 is less than the band gap of the second metal oxide layer 220. Thereby, a two-dimensional electron gas 2DEG is formed at the interface between the first metal oxide layer 210 and the second metal oxide layer 220. A thickness T2 of the second metal oxide layer 220 is less than a thickness T1 of the first metal oxide layer 210, thereby the two-dimensional electron gas 2DEG is more readily formed at the interface. In some embodiments, the thickness T1 of the first metal oxide layer 210 is 10 nm to 60 nm, and the thickness T2 of the second metal oxide layer 220 is 5 nm to 30 nm. In some embodiments, the material of the first metal oxide layer 210 and the second metal oxide layer 220 includes a quaternary compound such as indium gallium zinc oxide, indium tin zinc oxide, aluminum zinc tin oxide, indium tungsten zinc oxide, or includes a ternary compound of two metal elements in the above quaternary compounds and an oxygen element.

The second metal oxide layer 220 includes a first doped region 222, a second doped region 226, and a first channel region 224 located between the first doped region 222 and the second doped region 226. In some embodiments, the first doped region 222 and the second doped region 226 are formed by hydrogen plasma treatment, wherein the oxygen vacancy concentration of the first doped region 222 and the second doped region 226 is less than the oxygen vacancy concentration of the first channel region 224, and the conductivity of the first doped region 222 and the second doped region 226 is higher than the conductivity of the first channel region 224.

The gate dielectric layer 110 is located on the second metal oxide layer 220. In some embodiments, the material of the gate dielectric layer 110 includes silicon oxide, silicon nitride, silicon oxynitride, hafnium oxide, aluminum oxide, or other insulating materials. In some embodiments, the thickness of the gate dielectric layer 110 is 50 nm to 300 nm.

The first gate 230 is located on the gate dielectric layer 110. The first gate 230 is overlapped with the first channel region 224 of the first metal oxide layer 210 and the second metal oxide layer 220 in a normal direction ND of the top surface of the substrate 100. The gate dielectric layer 110 is located between the first gate 230 and the second metal oxide layer 220. The first gate 230 is in contact with the first channel region 224 of the second metal oxide layer 220 via the opening of the gate dielectric layer. In the present embodiment, the width of the opening of the gate dielectric layer is less than the width of the first channel region 224. In some embodiments, the material of the first gate 230 includes tungsten, molybdenum, platinum, gold, or other high work function metals, or combinations thereof. There is a Schottky contact between the first gate 230 and the second metal oxide layer 220.

The interlayer dielectric layer 120 is disposed on the gate dielectric layer 110. The interlayer dielectric layer 120 covers the first gate 230. In some embodiments, the material of the interlayer dielectric layer 120 includes silicon oxide, silicon nitride, silicon oxynitride, hafnium oxide, aluminum oxide, or other insulating materials. In some embodiments, the thickness of the interlayer dielectric layer 120 is 100 nm to 600 nm.

The first source 242 and the first drain 244 are disposed on the interlayer dielectric layer 120, and are respectively connected to the first doped region 222 and the second doped region 226 of the second metal oxide layer 220 via the contact holes in the interlayer dielectric layer 120. In some embodiments, the material of the first source 242 and the first drain 244 includes aluminum, titanium, molybdenum, copper, an alloy of the above metals, or a combination of the above materials. In some embodiments, there is a Schottky contact or an Ohmic contact between the first source 242 and the second metal oxide layer 220 and between the first drain 244 and the second metal oxide layer 220.

In the present embodiment, the first thin-film transistor 200 is a metal semiconductor field-effect transistor (MESFET), and the first thin-film transistor 200 is a normally-on transistor. Since the first thin-film transistor 200 includes a two-dimensional electron gas 2DEG, the first thin-film transistor 200 is suitable for a high-current driving transistor. Moreover, since the first gate 230 of the first thin-film transistor 200 is in contact with the second metal oxide layer 220, the charge trapping effect occurring in the insulating layer between the first gate 230 and the second metal oxide layer 220 may be reduced, thereby improving the efficiency of the first thin-film transistor 200.

The second thin-film transistor 300 is disposed on the substrate 100. In the present embodiment, the second thin-film transistor 300 is formed on the buffer layer 102. The second thin-film transistor includes a third metal oxide layer 320, a second gate 330, a second source 342, and a second drain 344. The second thin-film transistor 300 is electrically connected to the first thin-film transistor 200. For example, the second drain 344 of the second thin-film transistor 300 is electrically connected to the first gate 230 of the first thin-film transistor 200 via a wire not shown in FIG. 1.

The third metal oxide layer 320 is located on the substrate 100. In the present embodiment, the third metal oxide layer 320 is formed on the buffer layer 102. In some embodiments, a thickness T3 of the third metal oxide layer 320 is 5 nm to 30 nm. In some embodiments, the material of the third metal oxide layer 320 includes a quaternary compound such as indium gallium zinc oxide, indium tin zinc oxide, aluminum zinc tin oxide, indium tungsten zinc oxide, or includes a ternary compound of two metal elements in the above quaternary compounds and an oxygen element. The oxygen concentration of the first metal oxide layer 210 is less than the oxygen concentration of the third metal oxide layer 320. In some embodiments, the second metal oxide layer 220 and the third metal oxide layer 230 belong to the same patterned layer. It may also be said that the shapes of the second metal oxide layer 220 and the third metal oxide layer 230 are defined in the same patterning process. The second metal oxide layer 220 and the third metal oxide layer 230 include the same material.

The third metal oxide layer 320 includes a third doped region 322, a fourth doped region 326, and a second channel region 324 located between the third doped region 322 and the fourth doped region 326. In some embodiments, the third doped region 322 and the fourth doped region 326 are formed by hydrogen plasma treatment, wherein the oxygen vacancy concentration of the third doped region 322 and the fourth doped region 326 is higher than the oxygen vacancy concentration of the second channel region 324, and the conductivity of the third doped region 322 and the fourth doped region 326 is higher than the conductivity of the second channel region 324. In some embodiments, the first doped region 222 and the second doped region 226 of the second metal oxide layer 220 and the third doped region 322 and the fourth doped region 326 of the third metal oxide layer 320 are formed in the same hydrogen plasma treatment.

The second gate 330 is located on the gate dielectric layer 110. The second gate 330 is overlapped with the second channel region 324 of the third metal oxide layer 320 in the normal direction ND of the top surface of the substrate 100. The gate dielectric layer 110 is located between the second gate 330 and the third metal oxide layer 320. The second gate 330 is not in contact with the third metal oxide layer 320. In some embodiments, the first gate 230 and the second gate 330 belong to the same patterned layer. It may also be said that the shapes of the first gate 230 and the second gate 330 are defined in the same patterning process. The first gate 230 and the second gate 330 include the same material.

The second source 322 and the second drain 326 are disposed on the interlayer dielectric layer 120, and are respectively connected to the third doped region 322 and the fourth doped region 326 of the third metal oxide layer 320 via the openings in the interlayer dielectric layer 120. In some embodiments, the material of the second source 322 and the second drain 326 includes aluminum, titanium, molybdenum, copper, or a combination thereof. In some embodiments, there is a Schottky contact or an Ohmic contact between the second source 322 and the third metal oxide layer 320 and between the second drain 326 and the third metal oxide layer 320. In some embodiments, the first source 222, the first drain 226, the second source 322, and the second drain 326 belong to the same patterned layer. It may also be said that the shapes of the first source 222, the first drain 226, the second source 322, and the second drain 326 are defined in the same patterning process. The first source 222, the first drain 226, the second source 322, and the second drain 326 include the same material.

In the present embodiment, the second thin-film transistor 300 is a metal-oxide-semiconductor field-effect transistor (MOSFET), and the second thin-film transistor 300 is a normally-off transistor.

FIG. 2A to FIG. 2E are schematic cross-sectional views of a semiconductor device according to an embodiment of the invention.

Figure 2A:
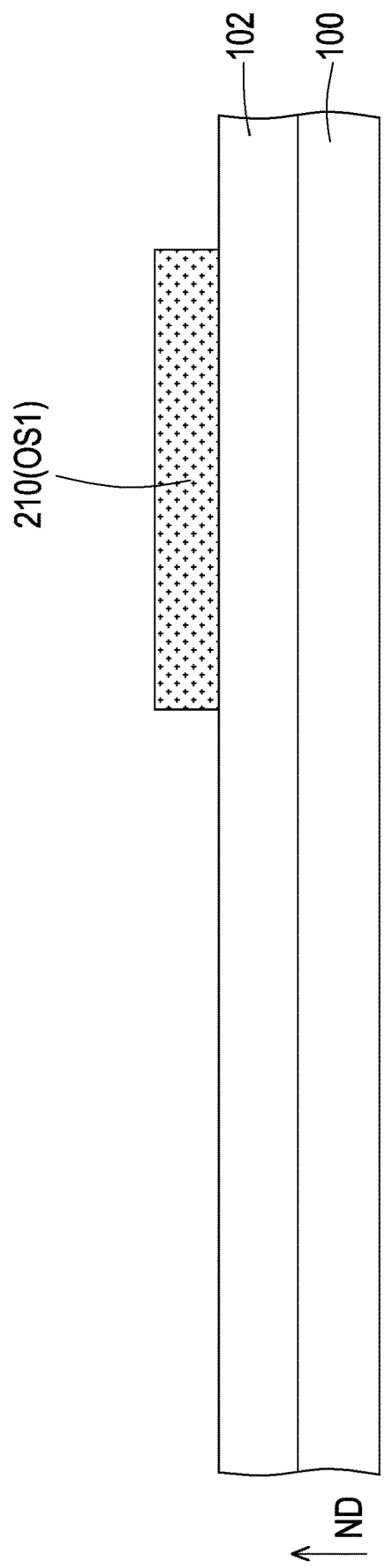
FIG. 2A to FIG. 2E are schematic cross-sectional views of a semiconductor device according to an embodiment of the invention.

Referring to FIG. 2A, a first metal oxide pattern OS1 is formed on the substrate 100. The first metal oxide pattern OS1 includes the first metal oxide layer 210.

Figure 2B:
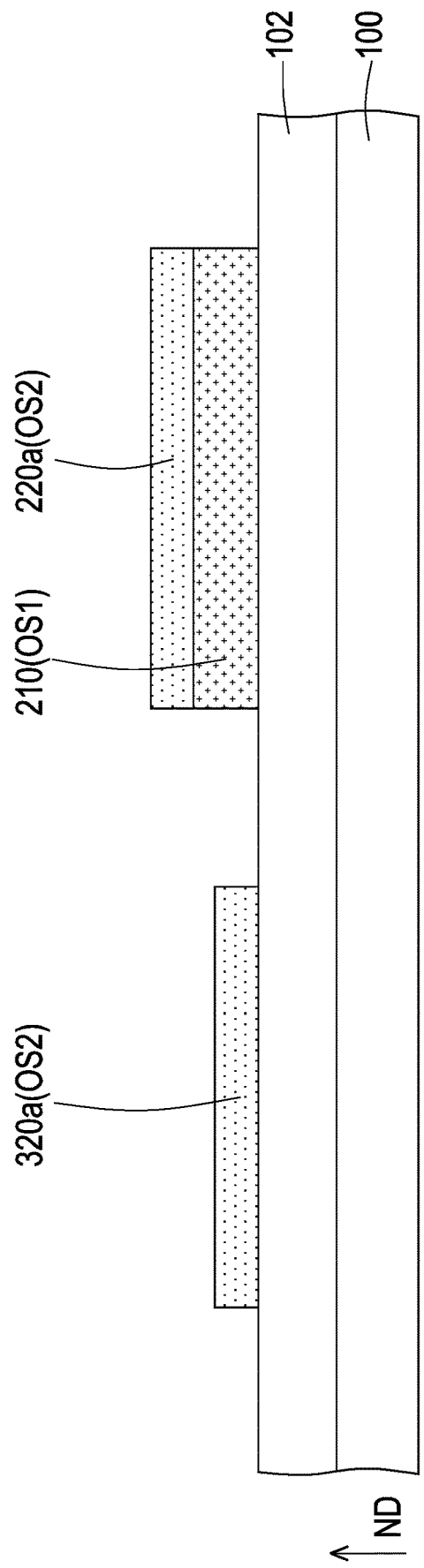

Referring to FIG. 2B, a second metal oxide pattern OS2 is formed on the first metal oxide pattern OS1 and the substrate 100. The second metal oxide pattern OS2 includes a second metal oxide layer 220a and a third metal oxide layer 320a.

Figure 2C:
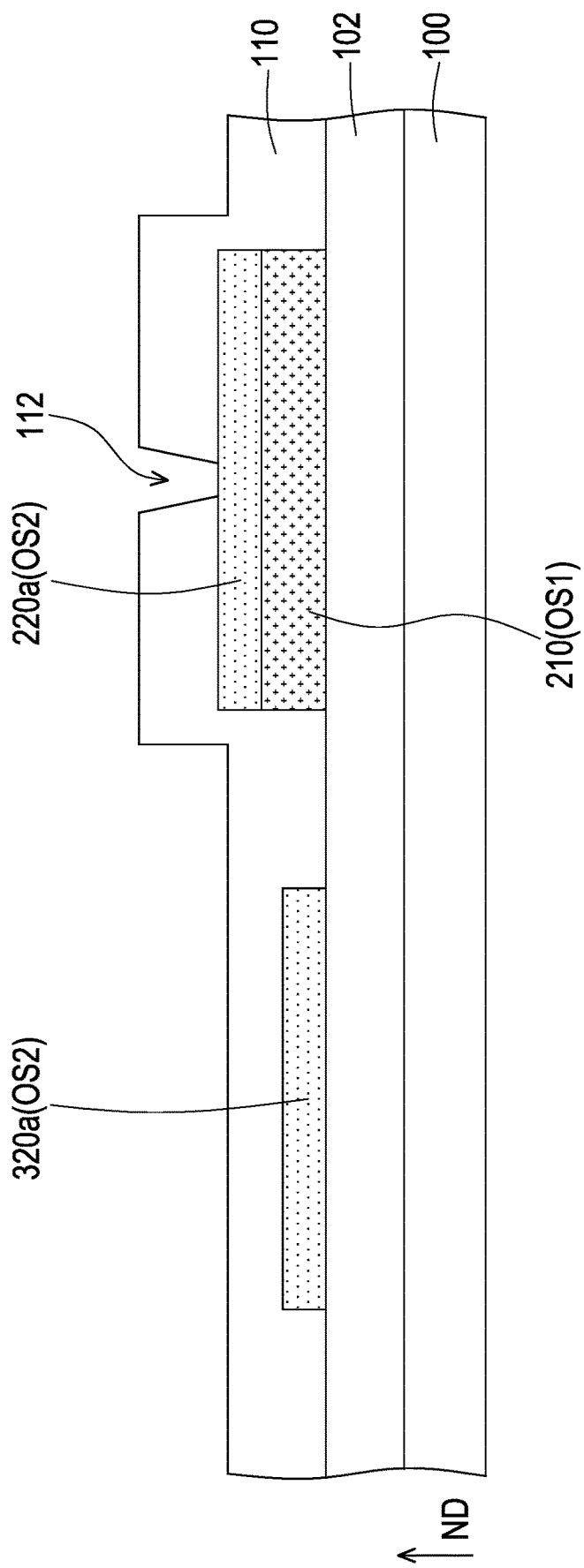

Referring to FIG. 2C, the gate dielectric layer 110 is formed on the second metal oxide pattern OS2. The gate dielectric layer 110 has an opening 112 overlapped with and exposing the second metal oxide layer 220a.

Figure 2D:
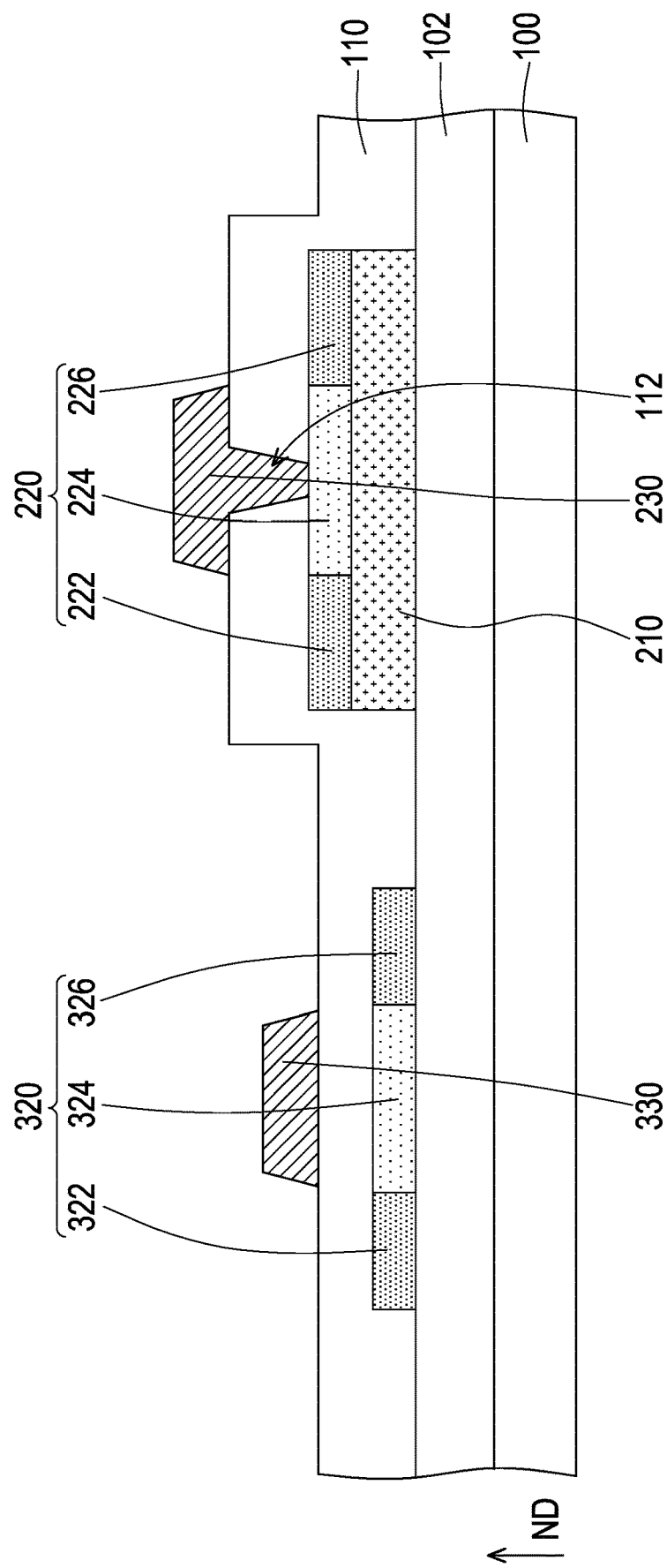

Referring to FIG. 2C and FIG. 2D, the first gate 230 and the second gate 330 are formed on the gate dielectric layer 110. The second metal oxide layer 220a is overlapped with the first gate 230, and the third metal oxide layer 320a is overlapped with the second gate 330. The first gate 230 is in contact with the second metal oxide layer 220a via the opening 112.

A doping process is performed on the second metal oxide layer 220a and the third metal oxide layer 320a using the first gate 230 and the second gate 330 as a mask, in order to form the second metal oxide layer 220 including the first doped region 222, the second doped region 226, and the first channel region 224 and the third metal oxide layer 320 including the third doped region 322, the fourth doped region 326, and the second channel region 324. The first channel region 224 is located between the first doped region 222 and the second doped region 226, and the second channel region 324 is located between the third doped region 322 and the fourth doped region 326. In the present embodiment, in the normal direction ND of the top surface of the substrate 100, the first channel region 224 and the second channel region 324 are overlapped with the first gate 230 and the second gate 330, respectively.

In some embodiments, the doping process is, for example, a hydrogen plasma doping process or other suitable processes, and the oxygen vacancy in the first doped region 222, the second doped region 226, the third doped region 322, and the fourth doped region 326 is reduced via a doping process, in order to improve the conductivity of the first doped region 222, the second doped region 226, the third doped region 322, and the fourth doped region 326.

Figure 2E:
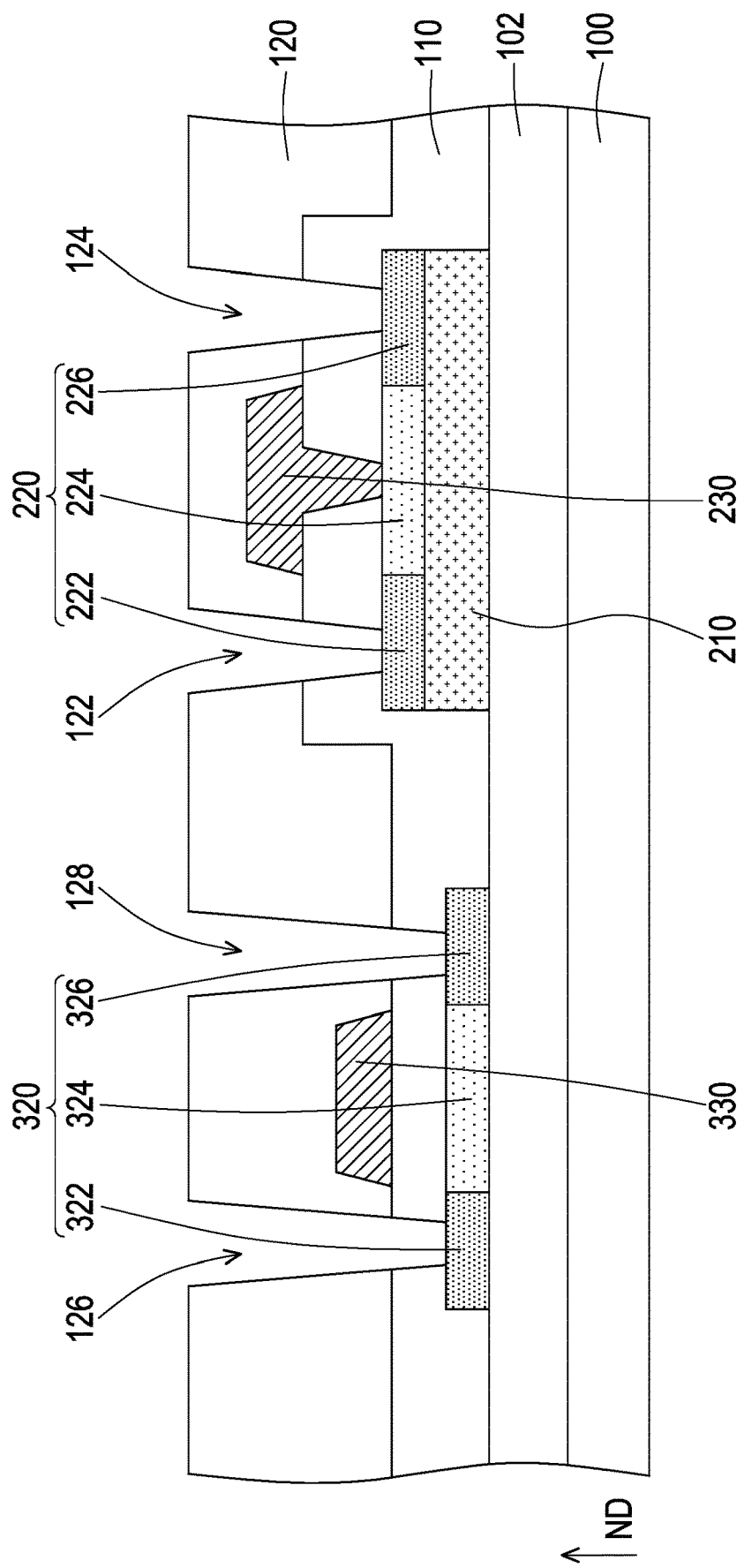

Referring to FIG. 2E, the interlayer dielectric layer 120 is formed on the gate dielectric layer 110. One or a plurality of etching processes are performed to form a first contact hole 122, a second contact hole 124, a third contact hole 126, and a fourth contact hole 128 through the interlayer dielectric layer 120 and the gate dielectric layer 110. The first contact hole 122 and the second contact hole 124 are overlapped with and expose the first doped region 222 and the second doped region 226 of the second metal oxide layer 220, and the third contact hole 126 and the fourth contact hole 128 are overlapped with and expose the third doped region 322 and the fourth doped region 326 of the third metal oxide layer 320.

Lastly, referring to FIG. 2E and FIG. 1, the first source 242, the first drain 244, the second source 342, and the second drain 344 are formed on the interlayer dielectric layer 120, and the first source 242, the first drain 244, the second source 342, and the second drain 344 are formed in the first contact hole 122, the second contact hole 124, the third contact hole 126, and the fourth contact hole 128. The first source 242 and the first drain 244 are respectively connected to the first doped region 222 and the second doped region 226 of the second metal oxide layer 220, and the second source 342 and the second drain 344 are respectively connected to the third doped region 322 and the fourth doped region 326 of the third metal oxide layer 320.

Figure 3:
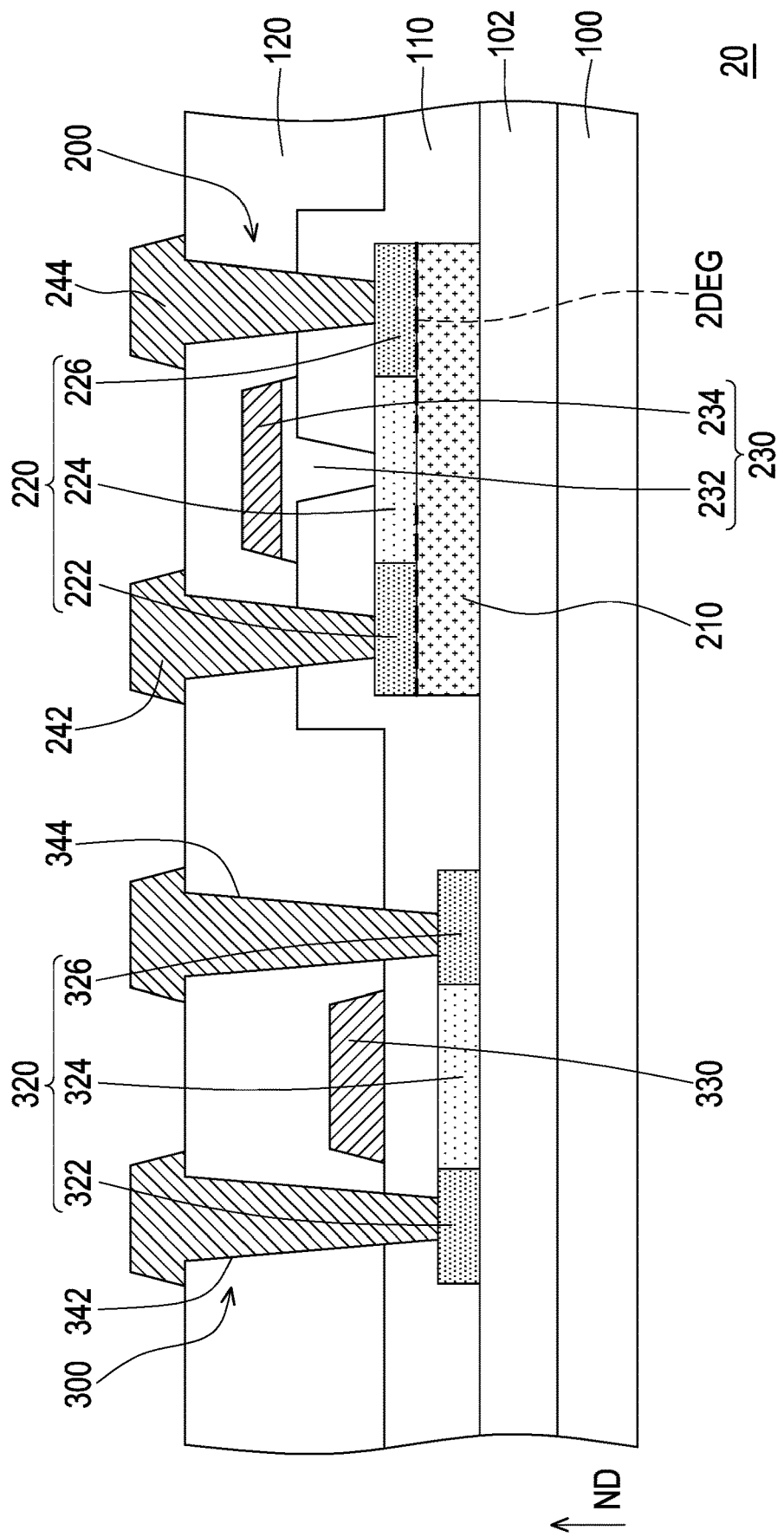
FIG. 3 is a schematic cross-sectional view of a semiconductor device according to an embodiment of the invention.

FIG. 3 is a schematic cross-sectional view of a semiconductor device according to an embodiment of the invention. It should be mentioned here that, the embodiment of FIG. 3 adopts the reference numerals of the embodiments of FIG. 1 to FIG. 2E and a portion of the contents thereof, wherein the same or similar numerals are used to represent the same or similar devices and descriptions of the same technical contents are omitted. The omitted portions are as described in the above embodiments and are not repeated herein.

The main difference between a semiconductor device 20 of FIG. 3 and the semiconductor device 10 of FIG. 1 is that the first gate electrode 230 of the semiconductor device 20 includes a multi-layer structure.

Referring to FIG. 3, the first gate 230 includes a stack of a metal layer 234 and a P-type semiconductor layer 232, wherein the P-type semiconductor layer 232 is in contact with the second metal oxide layer 220. In the present embodiment, the first thin-film transistor 200 is a normally-off transistor.

Figure 4:
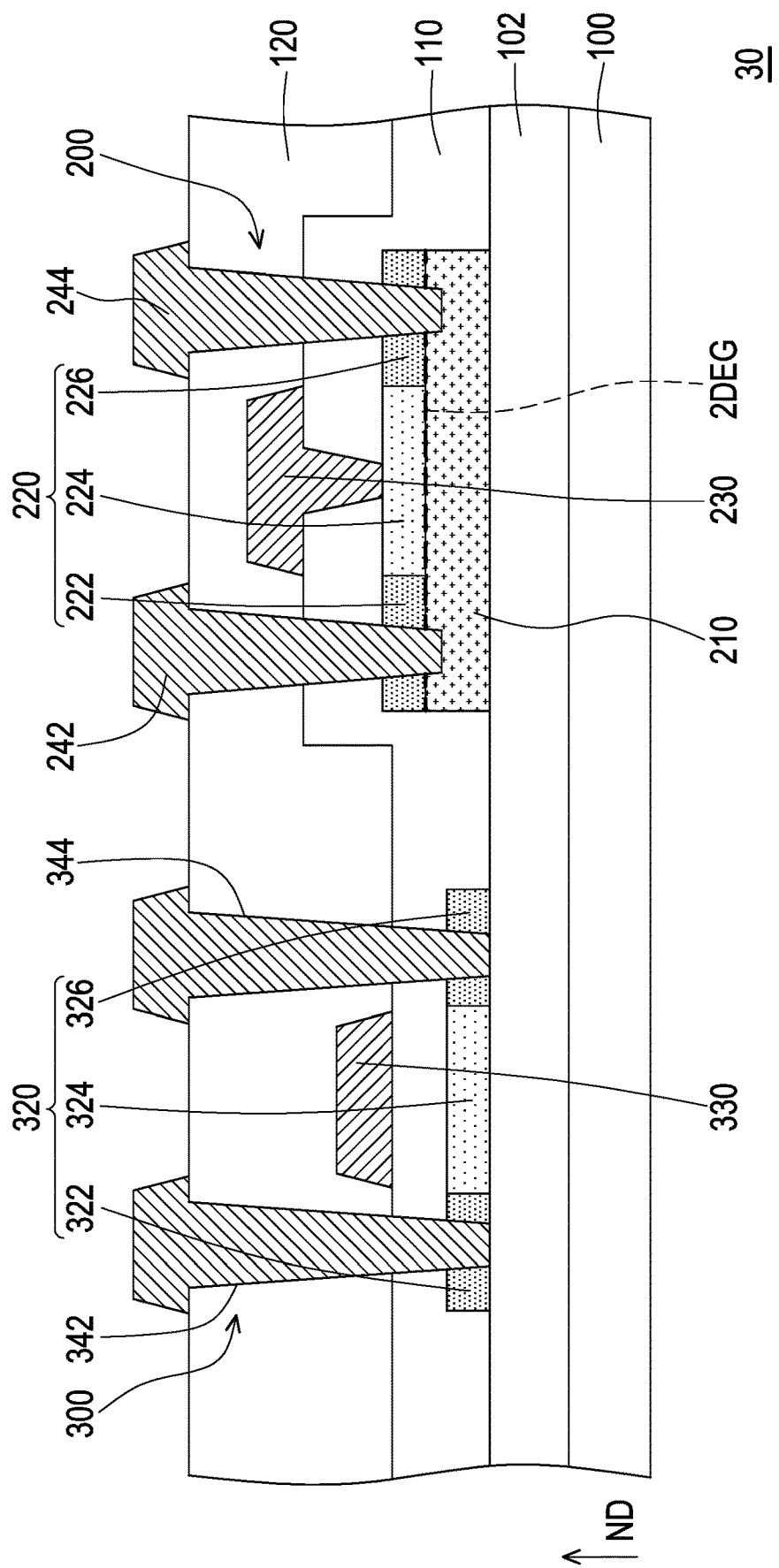
FIG. 4 is a schematic cross-sectional view of a semiconductor device according to an embodiment of the invention.

FIG. 4 is a schematic cross-sectional view of a semiconductor device according to an embodiment of the invention. It should be mentioned here that, the embodiment of FIG. 4 adopts the reference numerals of the embodiments of FIG. 1 to FIG. 2E and a portion of the contents thereof, wherein the same or similar numerals are used to represent the same or similar devices and descriptions of the same technical contents are omitted. The omitted portions are as described in the above embodiments and are not repeated herein.

The main difference between a semiconductor device 30 of FIG. 4 and the semiconductor device 10 of FIG. 1 is that the first source 242 and the first drain 244 of the semiconductor device 30 are extended through the second metal oxide layer 220.

Referring to FIG. 4, the first source 242 and the first drain 244 are extended through the second metal oxide layer 220 and in contact with the interface between the first metal oxide layer 210 and the second metal oxide layer 220. In other words, the first source 242 and the first drain 244 are in direct contact with the two-dimensional electron gas 2DEG, thereby increasing the output current of the first thin-film transistor 200.

In the present embodiment, the second source 342 and the second drain 344 are also extended through the third metal oxide layer 320, but the invention is not limited thereto. In other embodiments, the second source 342 and the second drain 344 do not pass through the third metal oxide layer 320.

Figure 5:
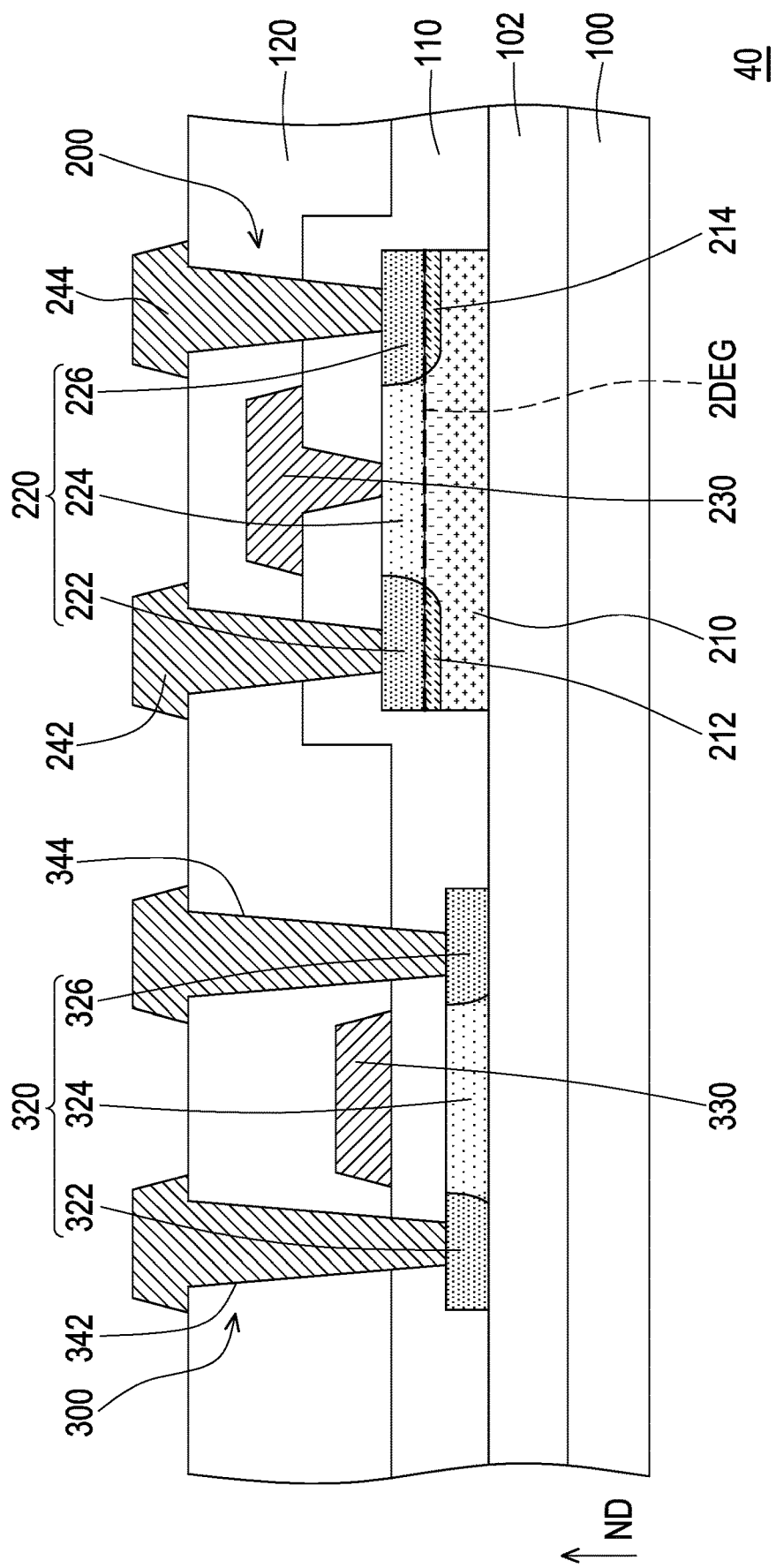
FIG. 5 is a schematic cross-sectional view of a semiconductor device according to an embodiment of the invention.

FIG. 5 is a schematic cross-sectional view of a semiconductor device according to an embodiment of the invention. It should be mentioned here that, the embodiment of FIG. 5 adopts the reference numerals of the embodiments of FIG. 1 to FIG. 2E and a portion of the contents thereof, wherein the same or similar numerals are used to represent the same or similar devices and descriptions of the same technical contents are omitted. The omitted portions are as described in the above embodiments and are not repeated herein.

The main difference between a semiconductor device 40 of FIG. 5 and the semiconductor device 10 of FIG. 1 is that the first metal oxide layer 210 of the semiconductor device 40 includes a fifth doped region 212 and a sixth doped region 214.

In the present embodiment, a doping process is performed to form the first doped region 222 and the second doped region 226 in the second metal oxide layer 220, and the doping process forms the fifth doped region 212 and the sixth doped region 214 in the first metal oxide layer 210. In other words, dopants (such as hydrogen atoms) in the doping process pass through the second metal oxide layer 220 and then reach the first metal oxide layer 210, and the fifth doped region 212 and the sixth doped region 214 are formed in the first metal oxide layer 210. The fifth doped region 212 and the sixth doped region 214 are in contact with the bottom of the first doped region 222 and the bottom of the second doped region 226, respectively.

In some embodiments, the thickness of the fifth doped region 212 and the thickness of the sixth doped region 214 are less than the thickness of the first metal oxide layer 210.

In some embodiments, the widths of the first doped region 222, the second doped region 226, the third doped region 322, the fourth doped region 326, the fifth doped region 212, and the sixth doped region 214 are gradually reduced toward the substrate 100. The surfaces of the first doped region 222 and the second doped region 226 facing the first channel region 224 are arc surfaces, and the surfaces of the third doped region 322 and the fourth doped region 326 facing the second channel region 324 are arc surfaces.

Figure 6:
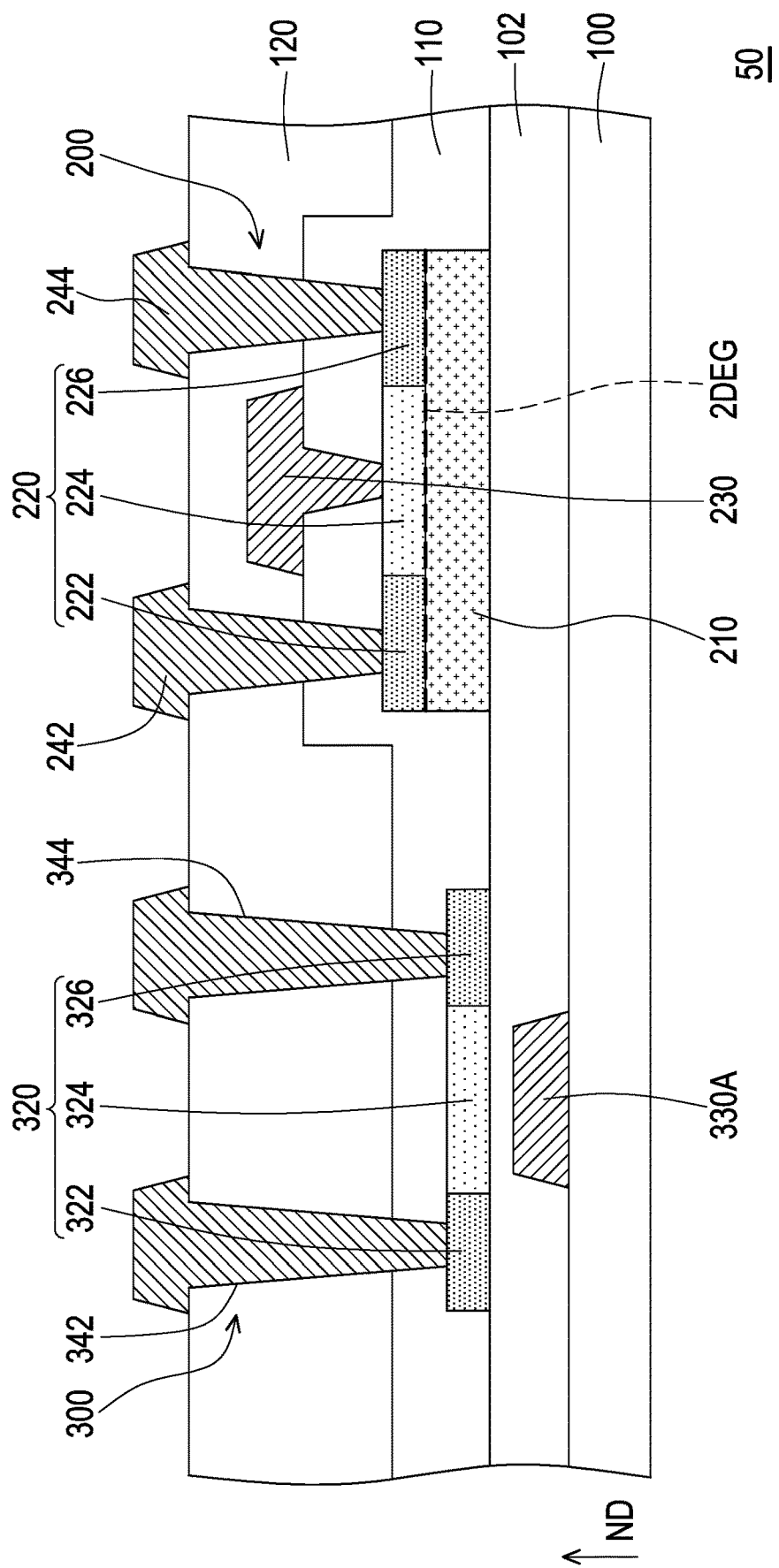
FIG. 6 is a schematic cross-sectional view of a semiconductor device according to an embodiment of the invention.

FIG. 6 is a schematic cross-sectional view of a semiconductor device according to an embodiment of the invention. It should be mentioned here that, the embodiment of FIG. 6 adopts the reference numerals of the embodiments of FIG. 1 to FIG. 2E and a portion of the contents thereof, wherein the same or similar numerals are used to represent the same or similar devices and descriptions of the same technical contents are omitted. The omitted portions are as described in the above embodiments and are not repeated herein.

The main difference between a semiconductor device 50 of FIG. 6 and the semiconductor device 10 of FIG. 1 is that the second thin-film transistor 300 of the semiconductor device 50 is a bottom gate-type thin-film transistor.

Referring to FIG. 6, a second gate 330A of the second thin-film transistor 300 is located between the third metal oxide layer 320 and the substrate 100. The first gate 230 and the second gate 330A belong to different patterned layers. It may also be said that the shapes of the first gate 230 and the second gate 330A are defined in different patterning processes.

Figure 7:
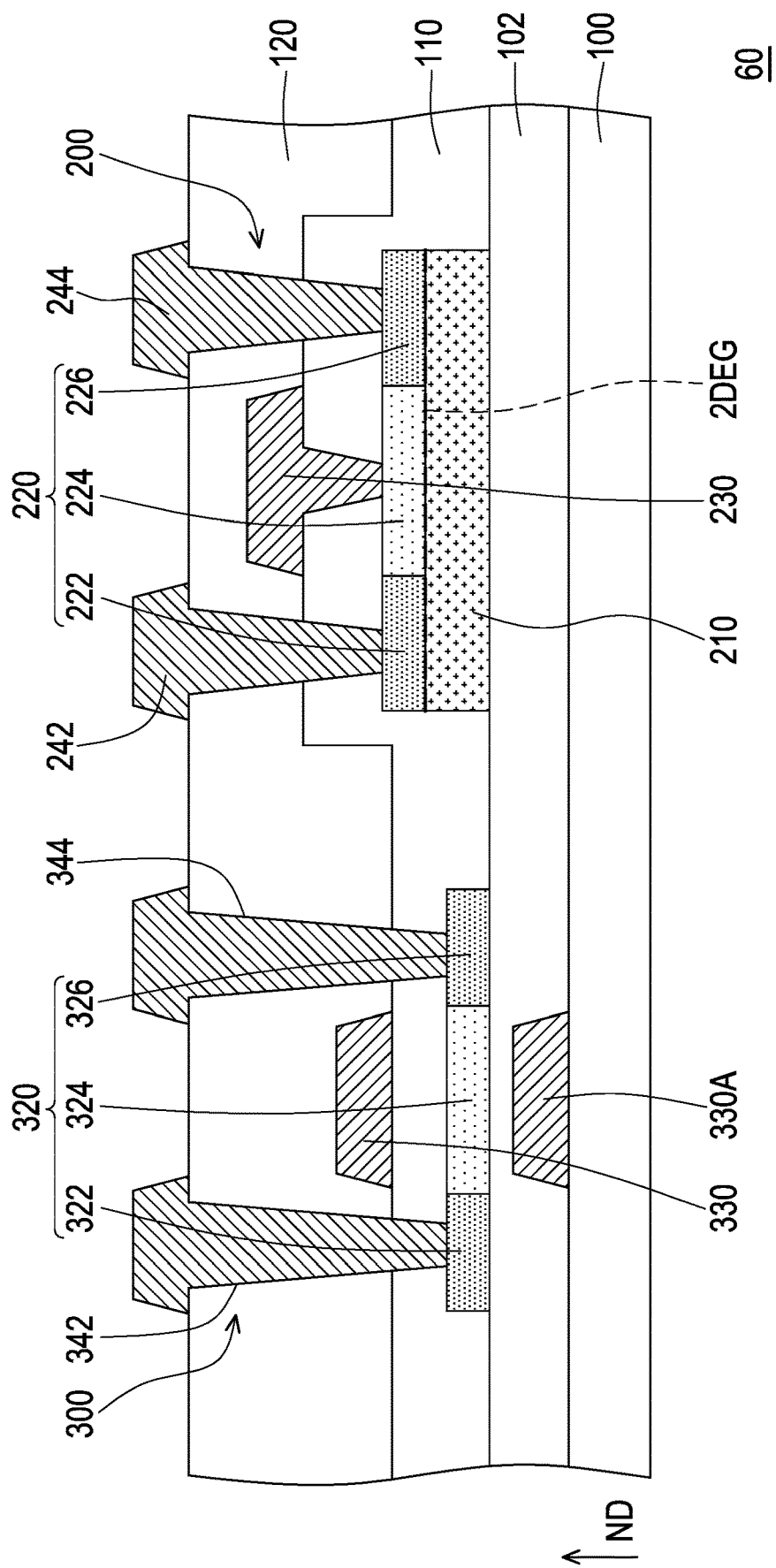
FIG. 7 is a schematic cross-sectional view of a semiconductor device according to an embodiment of the invention.

FIG. 7 is a schematic cross-sectional view of a semiconductor device according to an embodiment of the invention. It should be mentioned here that, the embodiment of FIG. 7 adopts the reference numerals of the embodiments of FIG. 1 to FIG. 2E and a portion of the contents thereof, wherein the same or similar numerals are used to represent the same or similar devices and descriptions of the same technical contents are omitted. The omitted portions are as described in the above embodiments and are not repeated herein.

The main difference between a semiconductor device 60 of FIG. 7 and the semiconductor device 10 of FIG. 1 is that the second thin-film transistor 300 of the semiconductor device 60 is a double-gate thin-film transistor.

Referring to FIG. 6, the second thin-film transistor 300 includes two gates, i.e., a second gate 330 and a second gate 330A, wherein the third metal oxide layer 320 is located between the second gate 330 and the second gate 330A.

Figure 8:
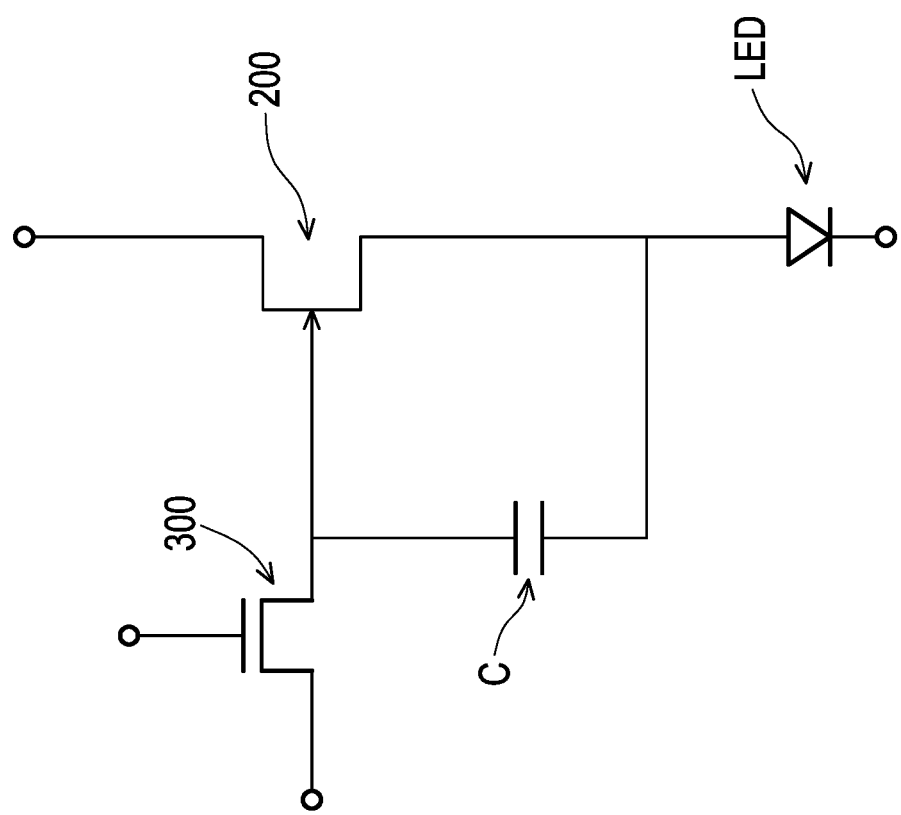
FIG. 8 is a schematic circuit diagram of a semiconductor device according to an embodiment of the invention.

FIG. 8 is a schematic circuit diagram of a semiconductor device according to an embodiment of the invention. FIG. 8 may be a schematic circuit diagram of the semiconductor device of any of the above embodiments.

Referring to FIG. 8, the first gate of the first thin-film transistor 200 is electrically connected to the second drain of the second thin-film transistor 300. In the present embodiment, a capacitor C is included between the first drain of the first thin-film transistor 200 and the second drain of the second thin-film transistor 300, and the first drain of the first thin-film transistor 200 is electrically connected to the light-emitting diode LED.

Based on the above, the first thin-film transistor of the invention includes a first metal oxide layer and a second metal oxide layer, wherein the interface between the first metal oxide layer and the second metal oxide layer has a two-dimensional electron gas, so the output current of the first thin-film transistor 200 may be increased.

What is claimed is:

1. A semiconductor device, comprising:
   a substrate;
   a first thin-film transistor disposed on the substrate, and the first thin-film transistor comprises:
      a first channel layer comprising a stack of a first metal oxide layer and a second metal oxide layer, wherein an oxygen concentration of the first metal oxide layer is less than an oxygen concentration of the second metal oxide layer, a thickness of the second metal oxide layer is less than a thickness of the first metal oxide layer, and a two-dimensional electron gas is located at an interface between the first metal oxide layer and the second metal oxide layer;
      a first gate overlapped with the first metal oxide layer and the second metal oxide layer, wherein a gate dielectric layer is located between the first gate and the second metal oxide layer; and
      a first source and a first drain respectively connected to the second metal oxide layer;
      and a second thin-film transistor disposed on the substrate and electrically connected to the first thin-film transistor, wherein the second thin-film transistor comprises:
  a second channel layer comprising a third metal oxide layer, wherein the second metal oxide layer and the third metal oxide layer belong to a same patterned layer;
  a second gate overlapped with the third metal oxide layer, wherein the gate dielectric layer is located between the second gate and the third metal oxide layer; and
  a second source and a second drain respectively connected to the third metal oxide layer.

2. The semiconductor device of claim 1, wherein the first gate is overlapped with the first metal oxide layer and the second metal oxide layer in a normal direction of a top surface of the substrate, wherein the first gate is in contact with the second metal oxide layer via an opening of the gate dielectric layer, and an interlayer dielectric layer is disposed on the gate dielectric layer, and
the first source and the first drain are disposed on the interlayer dielectric layer.

3. The semiconductor device of claim 2, wherein the second metal oxide layer comprises a first doped region, a second doped region, and a first channel region located between the first doped region and the second doped region, the interlayer dielectric layer comprises a first contact hole overlapped with the first doped region and a second contact hole overlapped with the second doped region, the first source is connected to the first doped region via the first contact hole, and the first drain is connected to the second doped region via the second contact hole.

4. The semiconductor device of claim 3, wherein the first metal oxide layer comprises a fifth doped region and a sixth doped region, and the fifth doped region and the sixth doped region are respectively in contact with a bottom of the first doped region and a bottom of the second doped region.

5. The semiconductor device of claim 4, wherein a thickness of the fifth doped region and a thickness of the sixth doped region are less than the thickness of the first metal oxide layer.

6. The semiconductor device of claim 2, wherein the first source and the first drain are extended through the second metal oxide layer and in contact with the interface of the first metal oxide layer and the second metal oxide layer.

7. The semiconductor device of claim 2, wherein the first gate comprises a stack of a metal layer and a P-type semiconductor layer.

8. The semiconductor device of claim 2, wherein the second gate is overlapped with the third metal oxide layer in the normal direction of the top surface of the substrate, and
the second source and the second drain are disposed on the interlayer dielectric layer.

9. The semiconductor device of claim 8, wherein the third metal oxide layer comprises a third doped region, a fourth doped region, and a second channel region located between the third doped region and the fourth doped region, the interlayer dielectric layer comprises a third contact hole overlapped with the third doped region and a fourth contact hole overlapped with the fourth doped region, the second source is connected to the third doped region via the third contact hole, and the second drain is connected to the fourth doped region via the fourth contact hole.

10. The semiconductor device of claim 8, wherein a material of the first gate and the second gate comprises tungsten, molybdenum, platinum, gold, or a combination thereof.

11. The semiconductor device of claim 1, wherein a material of the first metal oxide layer, the second metal oxide layer, and the third metal oxide layer comprises indium gallium zinc oxide, indium tin zinc oxide, aluminum zinc tin oxide, or indium tungsten zinc oxide.

12. The semiconductor device of claim 1, wherein the oxygen concentration of the first metal oxide layer is less than an oxygen concentration of the third metal oxide layer.

13. A manufacturing method of a semiconductor device, comprising:
  forming a first thin-film transistor on a substrate, wherein the first thin-film transistor comprises:
    a first channel layer comprising a stack of a first metal oxide layer and a second metal oxide layer, wherein an oxygen concentration of the first metal oxide layer is less than an oxygen concentration of the second metal oxide layer, a thickness of the second metal oxide layer is less than a thickness of the first metal oxide layer, and a two-dimensional electron gas is located at an interface between the first metal oxide layer and the second metal oxide layer;
    a first gate overlapped with the first metal oxide layer and the second metal oxide layer, wherein a gate dielectric layer is located between the first gate and the second metal oxide layer; and
    a first source and a first drain respectively connected to the second metal oxide layer; and
  forming a second thin-film transistor on the substrate, wherein the second thin-film transistor is electrically connected to the first thin-film transistor, and the second thin-film transistor comprises:
    a second channel layer comprising a third metal oxide layer, wherein the second metal oxide layer and the third metal oxide layer are formed simultaneously;
    a second gate overlapped with the third metal oxide layer, wherein the gate dielectric layer is located between the second gate and the third metal oxide layer; and
    a second source and a second drain respectively connected to the third metal oxide layer.

14. The manufacturing method of the semiconductor device of claim 13, wherein a method of forming the first thin-film transistor on the substrate and forming the second thin-film transistor on the substrate comprises:
  forming a first metal oxide pattern on the substrate, wherein the first metal oxide pattern comprises the first metal oxide layer;
  forming a second metal oxide pattern on the first metal oxide pattern and the substrate, wherein the second metal oxide pattern comprises the second metal oxide layer and the third metal oxide layer;
  forming the gate dielectric layer on the second metal oxide pattern, and the gate dielectric layer has an opening exposing the second metal oxide layer;
  forming the first gate on the gate dielectric layer, wherein the first gate is in contact with the second metal oxide layer via the opening;
  forming the second gate, wherein the third metal oxide layer is overlapped with the second gate;
  performing a doping process on the second metal oxide layer and the third metal oxide layer;
  forming an interlayer dielectric layer on the gate dielectric layer;

forming the first source, the first drain, the second source, and the second drain on the interlayer dielectric layer.

15. The manufacturing method of the semiconductor device of claim 14, wherein the doping process is performed to form a first doped region and a second doped region and a first channel region located between the first doped region and the second doped region in the second metal oxide layer, and form a third doped region and a fourth doped region and a second channel region located between the third doped region and the fourth doped region in the third metal oxide layer.

16. The manufacturing method of the semiconductor device of claim 15, wherein the doping process is performed to form a fifth doped region and a sixth doped region in the first metal oxide layer.

17. The manufacturing method of the semiconductor device of claim 14, wherein the doping process is performed with the first gate and the second gate as a mask.

18. The manufacturing method of the semiconductor device of claim 14, further comprising:

performing one or a plurality of etching processes to form a first contact hole, a second contact hole, a third contact hole, and a fourth contact hole through the interlayer dielectric layer and the gate dielectric layer, wherein the first contact hole and the second contact hole are overlapped with the second metal oxide layer, and the third contact hole and the fourth contact hole are overlapped with the third metal oxide layer; and forming the first source, the first drain, the second source, and the second drain in the first contact hole, the second contact hole, the third contact hole, and the fourth contact hole, respectively.

19. The manufacturing method of the semiconductor device of claim 14, wherein the first source and the first drain are extended through the second metal oxide layer, and the second source and the second drain are extended through the third metal oxide layer.

* * * * *